United States Patent
Akiyama et al.

(10) Patent No.: US 6,537,860 B2
(45) Date of Patent: Mar. 25, 2003

(54) METHOD OF FABRICATING POWER VLSI DIODE DEVICES

(75) Inventors: Hidenori Akiyama, Miyagi (JP); Paul Chang, Saratoga, CA (US); Geeng-Chuan Chern, Cupertino, CA (US); Wayne Y. W. Hsueh, San Jose, CA (US); Haru Ohkawa; Yasuo Ohtsuki, both of Miyagi (JP); Vladimir Rodov, Redondo Beach, CA (US)

(73) Assignees: APD Semiconductor, Inc., San Jose, CA (US); Fujifilm Microdevices Company, Ltd., Miyagi (JP)

( * ) Notice: Subject to any disclaimer, the term of this patent is extended or adjusted under 35 U.S.C. 154(b) by 0 days.

(21) Appl. No.: 09/739,732

(22) Filed: Dec. 18, 2000

(65) Prior Publication Data

US 2002/0076860 A1 Jun. 20, 2002

(51) Int. Cl.⁷ .................. H01L 21/332; H01L 21/8238; H01L 21/336; H01L 21/425
(52) U.S. Cl. ..................... 438/135; 438/217; 438/223; 438/289; 438/291; 438/306; 438/527
(58) Field of Search ............................... 438/134–138, 438/174, 175, 184, 185, 194, 195, 199, 217, 223, 224, 252, 276, 289, 291, 303, 305, 306, 519, 527, 529

(56) References Cited

U.S. PATENT DOCUMENTS

| 3,602,777 A | 8/1971 | Berman |
| 4,281,448 A | 8/1981 | Barry et al. |
| 4,903,189 A | 2/1990 | Ngo et al. |
| 4,967,243 A | 10/1990 | Baligia et al. |
| 4,982,260 A | 1/1991 | Chang et al. |
| 5,021,861 A | 6/1991 | Baliga |
| 5,111,253 A | 5/1992 | Korman et al. |

(List continued on next page.)

FOREIGN PATENT DOCUMENTS

DE   4121052 A1   6/1991

OTHER PUBLICATIONS

"Synchronous Rectification" Synchronous Rectification Improves With Age PCIM Aug. 1998 Bob Chrisitiansen, Samsung Semiconductor, San Jose, California.

(List continued on next page.)

Primary Examiner—John F. Niebling
Assistant Examiner—Viktor Simkovic
(74) Attorney, Agent, or Firm—Myers, Dawes & Andras LLP

(57) ABSTRACT

A method for manufacturing a discrete power rectifier device having a VLSI multi-cell design employs a two spacer approach to defining a P/N junction profile having good breakdown voltage characteristics. The method provides highly repeatable device characteristics at reduced cost. The active channel regions of the device are also defined using the same two spacers. The method is a self-aligned process and channel dimensions and doping characteristics may be precisely controlled despite inevitable process variations in spacer formation. Only two masking steps are required, and additional spacers for defining the body region profile can be avoided, reducing processing costs.

19 Claims, 5 Drawing Sheets

U.S. PATENT DOCUMENTS

| | | |
|---|---|---|
| 5,396,085 A | 3/1995 | Baliga |
| 5,416,354 A | 5/1995 | Blackstone |
| 5,430,315 A | 7/1995 | Rumennik |
| 5,504,359 A | 4/1996 | Rodder |
| 5,610,085 A | 3/1997 | Yuan et al. |
| 5,719,411 A | 2/1998 | Ajit |
| 5,818,084 A | 10/1998 | Williams et al. |
| 5,825,079 A | 10/1998 | Metzler et al. |
| 5,874,760 A | 2/1999 | Burns, Jr. et al. |
| 5,877,515 A | 3/1999 | Ajit |
| 5,886,383 A | 3/1999 | Kinzer |
| 6,127,212 A * | 10/2000 | Chen et al. ............... 438/199 |
| 6,225,176 B1 * | 5/2001 | Yu ............................ 438/305 |
| 6,235,600 B1 * | 5/2001 | Chiang et al. ............ 438/305 |
| 6,258,680 B1 * | 7/2001 | Fulford, Jr. ............... 438/305 |
| 6,329,225 B1 * | 12/2001 | Rodder ..................... 438/151 |
| 6,331,455 B1 * | 12/2001 | Rodov et al. ............. 438/138 |

OTHER PUBLICATIONS

"Improved MOSFET" An Important Milestone Toward a New Power MOSFET Generation PCIM Sep. 1998 L. Lorenz, M. Maerz and G. Deboy, Siemens AG, Munihch, Germany.

* cited by examiner

METHOD OF FABRICATING POWER VLSI DIODE DEVICES

BACKGROUND OF THE INVENTION

1. Field of the Invention

The present invention relates to methods of fabricating, discrete semiconductor devices and in particular power semiconductor devices. More particularly, the present invention relates to fabricating power semiconductor diodes.

2. Background of the Invention

Power semiconductor rectifiers have a variety of applications including applications in power supplies and voltage converters. For example, an important application of such rectifiers is in DC to DC voltage converters and power supplies for personal computers and other electronic devices and systems. In such applications, it is important to provide both a fast recovery time for the semiconductor rectifier and a low forward voltage drop across the rectifier ($V_f$). In particular, DC to DC voltage converter applications employ switched inputs and the recovery time of the rectifier used in the voltage converter will affect the dynamic losses for a given frequency of operation of the input. Also, a fast recovery time is needed for rectification of high frequency signals which are present in computers and many other electronic devices.

A low $V_f$ in turn is needed in low voltage applications including power supplies for computers and other low voltage (e.g., 12 volt and lower) electronics applications. In particular, computer applications will typically require both a five volt power supply and a 3.5 volt power supply and in the future it may be as low as a one volt power supply. In converting the input five volt power supply to a 3.5 volt power supply, the voltage converter will inevitably introduce a loss due to the $V_f$ drop across the rectifier in the converter circuit. In typical fast recovery semiconductor diodes employed in such devices, the voltage drop $V_f$ may be approximately 0.7–0.8 volts. This results in a significant percentage of available power being wasted due to the voltage drop across the rectifier. For example, as much as 40% of the available power may be wasted in a two step voltage conversion from a 5 volt input to a one volt output. As a result, a significant portion of the available power may be simply dissipated in the device due to the relatively high $V_f$. This wasted power is obviously significant in laptop and notebook computers and other portable devices relying on battery power. However, such wasted power is also a significant problem in desktop computers and other devices due to heat generation.

A discrete power rectifier device providing these desirable features has been disclosed in U.S. patent application Ser. No. 09/283,537 filed Apr 1, 1999. The process takes full advantage of the high degree of controllability in the modern VLSI IC manufacturing which allows a generation of very high density of conducting elements, leading to low $V_f$ devices. At the same time, the disclosed process is highly self aligned and therefore is very cost efficient.

The importance of the latter quality can not be overestimated: any commercial production of commodity products will always be dictated by cost considerations.

A thorough examination of a structure described in the 537 Application reveals that the body concentration profile (usually B for the more common device polarity) has to satisfy at least two different requirements:

a) support high breakdown voltage and,
b) precisely control V threshold (main factor in determining Vf).

In general terms such a situation calls for the capability to create almost any possible (desirable) concentration profiles (both in Vertical as well as in Horizontal directions) which generally speaking does not conform to any standard impurity profiles generated by Ion Implantation and Annealing (Diffusion) steps.

Such capability is described in the application Ser. No. 09/283,537, where it is suggested that multiple spacers and corresponding Implants (one or more per each spacer) commensurate with different annealing steps for different implants can generate profits of almost unlimited flexibility.

In real implemented processes it turned out that two spacers, two implantation and annealing steps generate sufficient optimization.

Many Boron Implants may take many spacers, which may become prohibitively expensive (e.g. can preclude such process from being ever implemented in mass production). Although a two spacer process can be acceptable as a generator of a suitable compromise between V forward (V threshold) and V breakdown, it's still expensive and reduces desired profit margin.

In view of the above, it will be appreciated that a need presently exists for a method of fabricating a complex IC discrete rectifier device which can reduce processing costs, which is readily compatible with available integrated circuit processing techniques and which may provide a device with a high breakdown voltage such as desired for power applications.

SUMMARY OF THE INVENTION

The present invention provides a method for manufacturing a rectifier device which is compatible with existing semiconductor technology, which provides a high degree of reliability in device characteristics and which can provide such devices at reduced cost.

In a preferred embodiment, the present invention provides a method of fabricating a rectifier device employing a reduced number of processing steps and hence reduced cost. The method employs forming a plurality of pedestals on the top surface of a semiconductor substrate which pedestals are used to align the structures forming the active cells. A gate is formed on the pedestal sidewalls and substrate adjacent to the pedestals as a thin conducting (e.g., implanted) layer on top of the gate oxide. A first spacer is formed adjacent the pedestal sidewalls, followed by a first implant into the semiconductor substrate which is laterally defined by the first spacer to form a body region. The first spacer is then removed. A second thicker spacer is then formed adjacent the pedestal sidewalls, followed by a second implant of a dopant of the first conductivity type laterally defined by the second spacer. This second implant has a depth and/or concentration which differs from that of the first implant to provide a desired depth and dopant concentration profile to the body region. A third implant is performed, also using the second spacer, of a dopant of a second conductivity type. The first and third implants define channel regions adjacent the pedestals and below the gate oxide while the first and second implants tailor the P/N junction profile with the substrate to improve breakdown resistance. The method proceeds by forming first and second electrical contact metallization layers on the top and bottom surfaces of the substrate, providing a vertical device structure having a current flow path between the surfaces.

More specifically, the use of two spacers both referenced to the pedestal sidewalls in a self aligned manner, allows the channel dimensions and dopant levels to be precisely controlled despite inevitable process variations in spacer sidewall formation. The present invention also provides a tailored body region profile using the same two spacers employed for self aligned channel formation. Therefore, a body region doping profile can be provided which increases breakdown voltage, without the need for additional spacers. Also, only two masking steps are required. These features provide significant cost advantages. An optional third masking step may be employed to form guard ring and plug regions.

Further features and advantages of the present invention will be appreciated by review of the following detailed description of the invention.

DETAILED DESCRIPTION OF THE INVENTION

Referring to FIGS. 1A–1K, the process flow for a preferred embodiment of a method of manufacturing a VLSI discrete power rectifier device in accordance with the present invention is illustrated in a series of schematic sectional drawings. The VLSI power rectifier device employs a large number of identical cells which cumulatively provide the desired high power capacity for the device. FIGS. 1A–1K illustrate a portion of the wafer as it is processed, the illustrated portion generally corresponding to a small portion of a single device as it is impractical to show an entire device which may have several million cells. Furthermore, it will be appreciated that in practice the individual device structure is repeated many times over the surface of the wafer in which multiple dies are processed together.

Figure 1A:
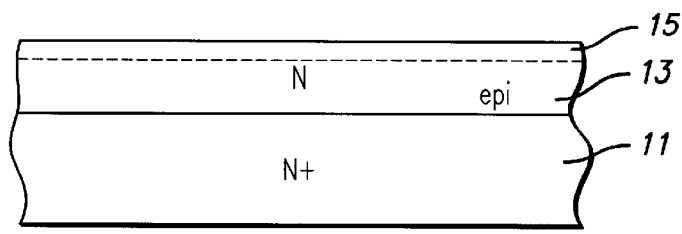
FIGS. 1A–1K are sectional schematic drawings illustrating the preferred method of fabricating the power rectifier devices provided by the present invention.

Referring first to FIG. 1A, a section of a wafer on which two adjacent cells will be formed is illustrated. The process of the present invention commences with an epitaxial region 13 being formed on substrate 11 in a conventional manner. The process flow will be illustrated for an N channel device and, accordingly, the epitaxial region 13 is shown as N type having, for example, As concentrations in the range of $10^{14}$ to $10^{16}$ cm$^{-3}$. If a P channel device is desired, the dopant will be P type instead of a N type and it is to be understood herein that all such doped regions may simply be reversed from N to P type and P to N type to create a P channel device and such is implied for each of the following process steps.

An optional N type region 15 of higher concentration may also be provided to tailor the threshold voltage of the channel regions. Region 15 may be implanted to increase the dopant concentration levels or increased dopants may be introduced during the final growth of the epitaxial layer 13 to provide the desired increased concentration levels. The region 15 may in particular be desired if the device is operated in the depletion mode. For convenience of illustration the region 15 will be suppressed in the remaining drawings but it is to be understood that in appropriate cases, the layer 15 may be present as an upper layer of epitaxial region 13.

Figure 1B:
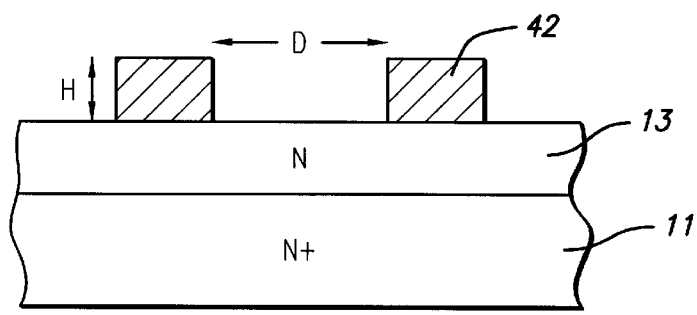

Referring to FIG. 1B, in the next step of the process of the present invention, a plurality of pedestal regions 42 are formed on the surface of the epitaxial layer 13. Pedestals 42 form the basic layout (pattern) for the active regions (or cells) and have a repetitive structure corresponding to the desired cell layout. For example, a rectangular cell layout may be employed and the pedestals would have a corresponding rectangular shape. Formation of the pattern of the pedestals represents the first necessary masking step in the process flow of the present invention. (In an optional embodiment described below, a prior masking step may be employed to lay out guard rings and plug regions at the edge and interior regions of the chip.) Pedestals 42 may preferably be formed of any electrically isolating materials commonly used in IC manufacturing (e.g. $SiO_2$, $Si_3N_4$, CVD Oxide, etc.) and may be grown or deposited in a conventional manner. The pedestals are spaced apart a distance D which may, for example, be about 1.0–2.0 microns and about 1.5 microns in a presently preferred embodiment. It will be appreciated that this distance may be greater or less depending on the layout geometry of the cells and also may be reduced as future technological advances allow semiconductor structures of smaller size to be created while retaining the desired control of device characteristics. The pedestals have a height H. For example, H may be approximately 0.5–1.5 microns, or about 1 micron, in a presently preferred embodiment. However, the height may be varied outside this range in accordance with the particular implementation process, the particular application of the device, and/or the semiconductor technology and equipment employed.

Figure 1C:
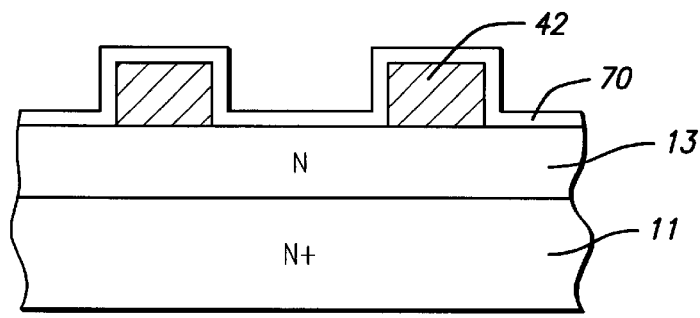

Referring to FIG. 1C, an oxide layer 70 is formed over the surface of the substrate and the pedestals, a portion of which oxide layer will ultimately become the gate oxide 18 discussed above. Preferably, a thin oxide layer is employed to allow more precise control of the threshold voltage of the device. For example, presently an oxide layer thickness of approximately 100 Å is preferred although a range from about 25 to 500 Å may be employed depending on the overall device characteristics desired.

Figure 1D:
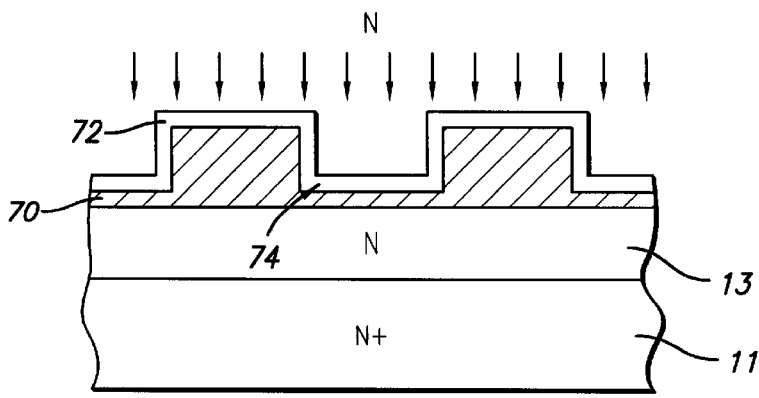

Referring to FIG. 1D, the next step of process flow of the present invention is illustrated. A doped Polysilicon layer 72 is formed on top of the oxide layer 70. The desired conductivity of the Polysilicon layer 72 can be provided by any convenient means (in situ, via Ion Implantation, etc.). (In FIG. 1D, the oxide layer 70 on top of the pedestal region 42 is suppressed since its functionality does not differ from that of the underlying pedestal region.) A portion of the Polysilicon layer 72 will ultimately become the gate regions of the completed device; therefore, it is imperative to control the dopant concentrations of the Polysilicon layer 72. The doping process itself can be by implantation as well as by other means of doping during deposition in situ, provided that the impurities do not penetrate through the gate oxide into the substrate. In a presently preferred embodiment, Polysilicon layer 72 is relatively thin, for example, from about 200–1,000 Å and approximately 500 Å. This thickness allows an implanted and RTP activated dopants into the silicon layer 72 to be achieved in a uniform manner over the portion of the layer which will ultimately form the gate structure 20. For example, an As implant in the range of $10^{19}$–$10^{21}$ cm$^{-3}$ may be provided in layer 72 (a boron implant may be employed if a P channel device is desired). Despite the thinness of layer 72, if the doping is done by Ion Implantation the portion of the Polysilicon layer 72 extending into the corner region 74 near the pedestal 42 will typically be difficult to implant with a consistent concentration level due to the presence of the vertical overhang of the layer 72. Therefore, this region 74 will preferably be excluded from the active gate region in a manner described in the following process steps. The thin Polysilicon gate deposition and implant process provided by the present invention allows a high temperature in situ doped Polysilicon deposition step to be avoided. This avoids undesirable effects due to such a high temperature step. In situ doping of the thin Polysilicon gate may be acceptable as long as it can be done at low enough temperature in order to prevent the dopant penetration into the substrate from the Polysilicon through the gate oxide.

Figure 1E:
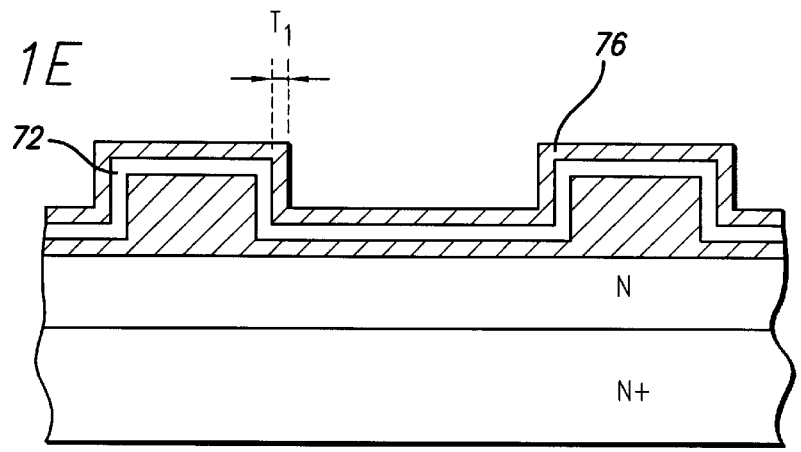
Figure 1F:
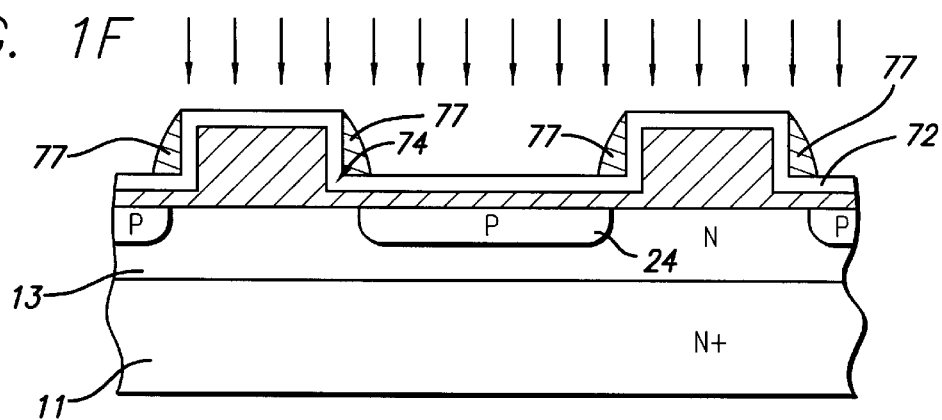

Referring to FIGS. 1E and 1F, the next stage in the process flow of the present invention is illustrated. As shown in FIG. 1E, a layer 76 is deposited on top of the polysilicon layer 72. An anisotropic etch is then employed to remove part of layer 76, leaving only the portions 77 on the sidewalls of pedestals, as shown in FIG. 1F. As will be appreciated by those skilled in the art, this is the standard spacer formation method. A blank boron implant is then performed to form p-type region 24 (or using an n-type implant to form n-type region in the case of a p-channel device). Spacers 77 are used to define the implant of the p-type body region 24 without using any photo mask. The spacers 77 are removed after the implant and the material out of which these spacers are made is therefore chosen to be suitable for a simple deposition and subsequent etching removal and may simply be an oxide layer deposited through conventional methods. The thickness of the spacer 77 is chosen to move the edge of the P implant away from the portion 74 of the gate which is not desirable for use in the active channel. For example, in a presently preferred embodiment, the spacer 77 may be approximately 1,000–10,000 Å or about 2,000 Å in particular. The implant of the P type body region may range from about $10^{15}$–$10^{18}$ cm$^{-3}$ of a suitable P type dopant such as boron (or N type dopant such as arsenic in the case of an N type body region in a P channel device). Some slope will inevitably be present in the sidewalls of the spacer 77 and therefore, it is impossible to precisely control the lateral positioning of the edge of the P implant. Therefore, the spacer 77 allows for such uncertainty in the lateral positioning of the edge of the P type body region.

Figure 1G:
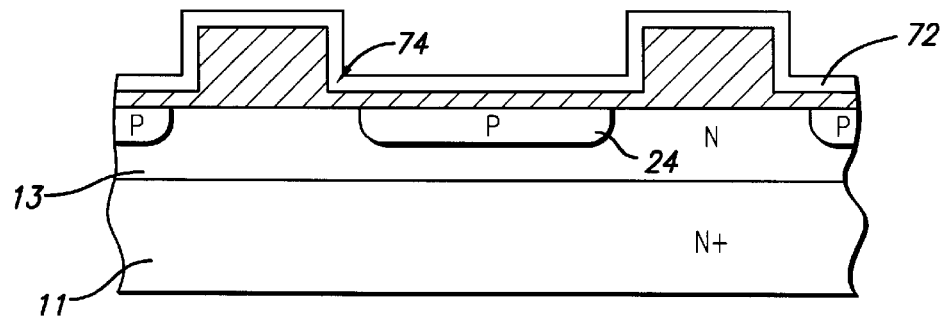

Referring to FIG. 1G, the process flow is illustrated after the first spacer layer 76 has been removed. As shown, the P type body region 24 is slightly shifted away from the region 74 of the polysilicon gate, which is subject to uncontrollable variations in the implant concentrations. Therefore, the edge of the channel region will be similarly displaced from this region and provide better control of device characteristics irrespective of unavoidable variations in implantation into the corner region 74 of the polysilicon layer 72.

Figure 1H:
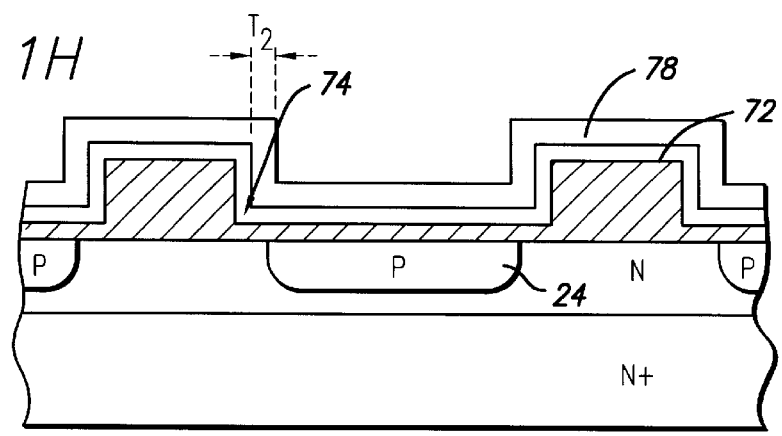

Referring to FIG. 1H, the next stage in the process flow of the present invention is illustrated. As shown, a second layer 78 is deposited on the polysilicon layer 72. Layer 78 may be Polysilicon deposited to a controlled thickness $T_2$. Thickness $T_2$ of the spacer generated by the anisotropic etch of the layer 78 is greater than $T_1$ and ensures there is no interference between the surface P concentration corresponding to the P type body region 24 and the highly concentrated N implant for the drain contact. In particular, in a presently preferred embodiment, the thickness $T_2$ of second layer 78 may be approximately 0.5 microns, but may be varied, for example, from about 0.3 microns to about 0.8 microns.

Figure 1I:
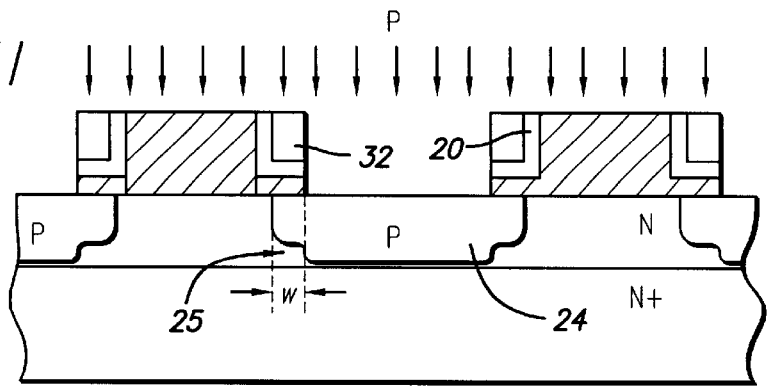

Referring to FIG. 1I, the next step in the process flow of the present invention is illustrated corresponding to reactive ion etching or other suitable anistropic etching of the layer 78 to form the composite spacer from spacers 20 and 32. This spacer formation etch can be stopped at the gate oxide or it can etch all the way down to expose the underlying silicon surface over a portion of the P type body region 24 as shown in FIG. 1I. The residual second spacer is indicated at 32. After the reactive ion etching or other an isotropic etching of the layer 78, a second body implant is performed as indicated by the arrows in FIG. 1I. The second body implant will be the same conductivity type dopant as the first body implant but will have differing depth or concentration level to tailor the PN junction 25.

Figure 1J:
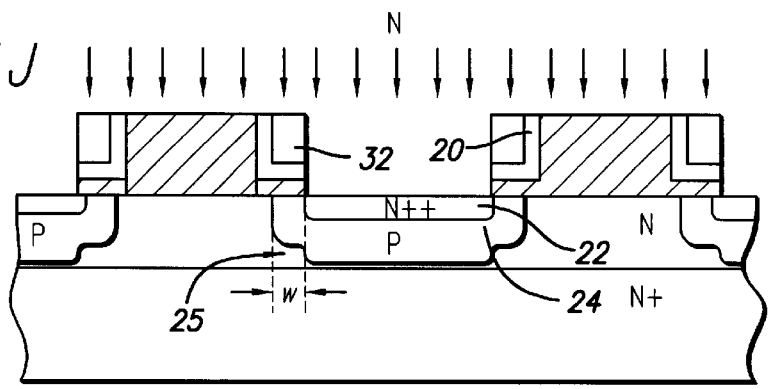

Referring to FIG. 1J, the drain region is implanted as illustrated by the vertical lines in FIG. 1J employing the same spacer 32 used for the second body implant discussed above. For example, in the case of an N type drain, arsenic may be implanted in the range of from approximately $10^{19}$ to $10^{21}$ cm$^{-3}$ to provide a highly effective contact with the metallization to be deposited over the contact region. (In the case of a P channel device, a similarly high concentration P type implant, e.g., of boron, will be provided in the contact region.) Since the residual second spacer layer 32 is polysilicon the N implant will give it a concentration level equal or greater than that of the thin polysilicon gate 20 providing a good contact to the underlying gate 20.

As described in the above embodiment the drain region implantation was made through the gate oxide. It is necessary to remove gate oxide from the drain region in order to provide good metal contact to it. The oxide etch can be done anisotropically (RIE) as well as using wet etch. Due to the thinness of the gate oxide both methods are acceptable.

Figure 1K:
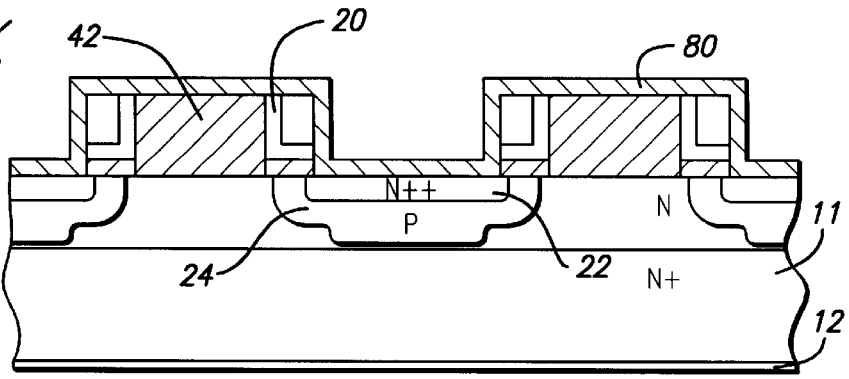

Referring to FIG. 1K, the next step in the process flow of the present invention is illustrated. As shown, a metallization layer 80 is deposited so as to make electrical contact with both the drain contact region 22 as well as the polysilicon gate 20. Layer 80 may be any of a number of known metal contact materials; and may be for example a titanium (Ti) layer. The method proceeds with a rapid thermal-processing step which converts the titanium to titanium silicide (TiSi). For example, the rapid thermoprocessing (RTP) step may proceed at a temperature of about 600–700° C. for a short period so that the conversion process is complete but the underlying contact region 22 is not adversely affected. The process proceeds with conventional steps of formation of a barrier metal layer, e.g., TiNi, on top of the layer 80, a masking step for individual chip contact metallization, thinning of the substrate 11, and formation of source contact 12.

It will be appreciated by those skilled in the art that the above process flow provides significant advantages both in the cost of the overall process, and hence cost of the devices made thereby. In particular, the described process flow only requires two masking steps, i.e., for formation of the pedestal regions 42 and for the chip metallization, which provides significant cost advantages over multi-step processes employed for formation of the power MOSFET devices employed in synchronous rectifier applications. Also, the process ensures repeatability of device characteristics and hence good yield. Furthermore, it will be appreciated that the method as illustrated provides the ability to provide a large number of active cells on the device surface since submicron device channel geometries may be provided making it possible to provide over 10 million active regions on a single integrated circuit chip. This provides low on resistance. Further advantages of the above-described process will be appreciated by those skilled in the art.

Figure 2A:
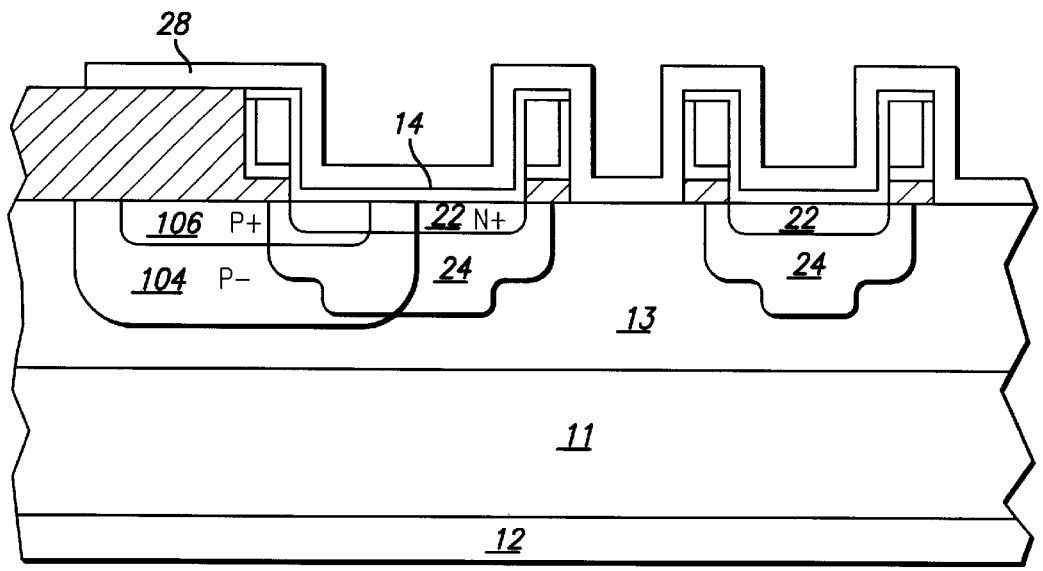
FIGS. 2A and 2B are side sectional and top views, respectively, of an edge portion of the integrated circuit chip of the rectifier device of the present invention illustrating a guard ring structure adjacent the contact pads.
Figure 2B:
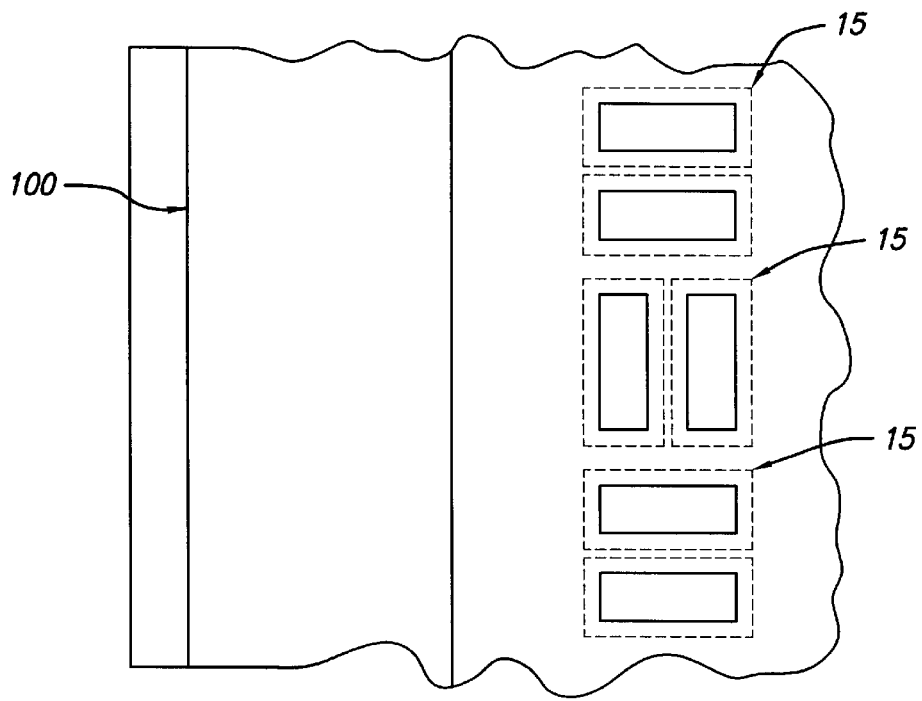

Referring to FIGS. 2A and 2B, a further aspect of the present invention is illustrated corresponding to a guard ring configuration surrounding the integrated circuit chip. The region of the integrated circuit illustrated in FIGS. 2A and 2B corresponds to an edge portion of the integrated circuit. Depending upon the particular voltage and current ranges for the particular application of the rectifier the guard ring may be necessary.

More specifically, referring to FIGS. 2A and 2B, an annular shaped guard ring 100 is formed. For example, the guard ring 100 may be a round, square or rectangular annular shape. As generally illustrated in FIG. 2B, the guard ring 100 will generally be dimensioned larger than the individual cells of the active portion of the device and, for example, may be from about 3–10 microns along one side of the guard ring, with, for example, about five microns being presently preferred. The guard ring 100 is preferably formed of a relatively deep P– region 104 in the case of N channel active devices (or N– region in the case of P channel active devices). For example, a boron implant of about $10^{15}$–$10^{16}$ cm$^{-3}$ with a depth of about 2,000–10,000 Å may be employed. A shallower P+ contact region 106 is formed on top of the P– region 104 to provide good ohmic contact with the metallization layer. For example, the P+ contact region 106 may comprise a boron implant with a concentration of about $10^{18}$–$10^{19}$ cm$^{-3}$.

As further illustrated in FIG. 2B, the guard ring implants 104 and 106 preferably abut against the body regions 24 of the adjacent cells 15 such that the guard ring in effect provides an extension of the body regions 24 of the cells. In this way, the relatively diffuse region 104 provides a low field blocking junction with the epitaxial region 13 adjacent the edge portion of the integrated circuit chip and the contacts 102, which region is most susceptible to breakdown. Accordingly, it will be appreciated that the guard ring structure illustrated in FIGS. 2A and 2B provides significant advantages in reducing undesired breakdown of the parasitic diodes present in the active cells of the power rectifier of the present invention.

Figure 3A:
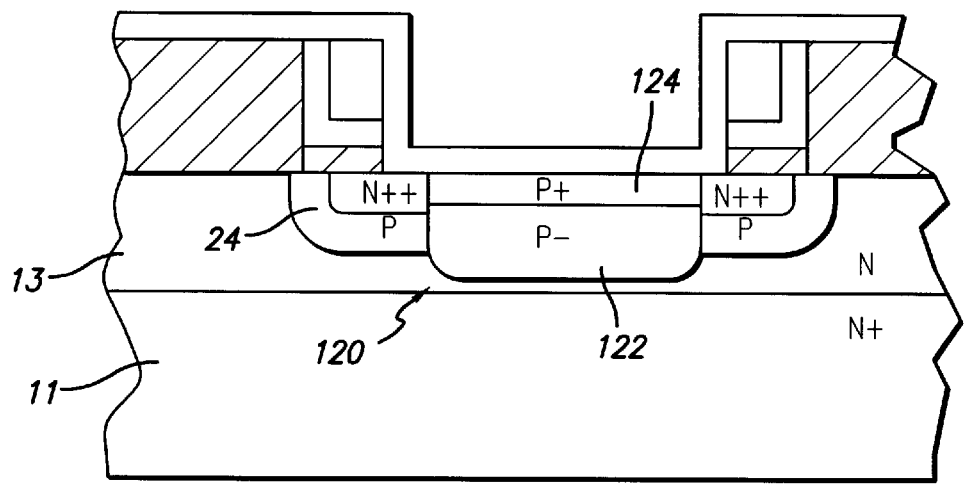
FIGS. 3A and 3B are side sectional and top views, respectively, of a central portion of the rectifier device illustrating a plug region in a further aspect of the present invention.
Figure 3B:
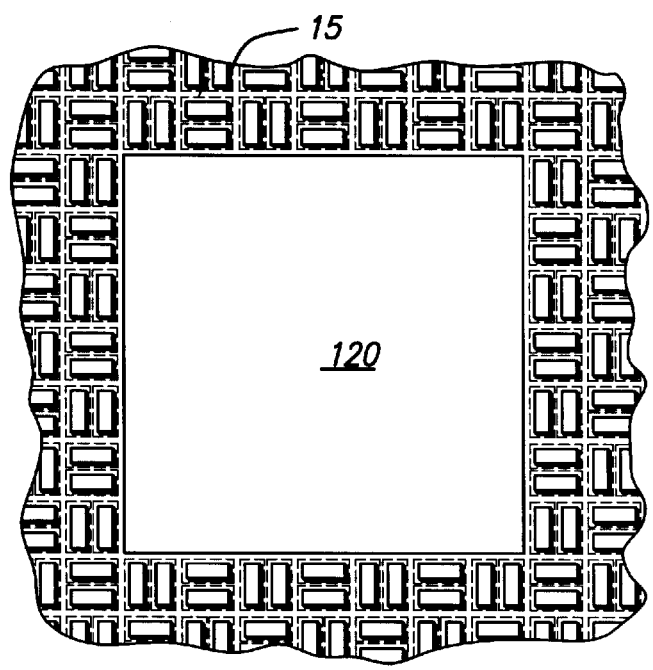

Referring to FIGS. 3A and 3B, a further aspect of the present invention is illustrated employing a plurality of plug regions 120 incorporated throughout the upper surface of the device. The plug regions 120 are provided to ensure that the active body regions 24 of the cells of the power rectifier are electrically at the same potential as the N type regions so that they do not "float". As is known in the art the presence of such floating regions can cause detrimental and unpredictable effects such as variations in switching speed or even failure of cells to switch off or on. Since the majority of the entire surface of the device is utilized as an active area, it is preferable to distribute such plugs 120 over the entire surface more or less evenly. Such a distribution provides similar resistive paths for the bleeding of charges preventing formation of areas of floating potentials. For example, the plug regions 120 may comprise approximately 110% of the total surface area of the device and as illustrated in FIG. 3B are situated so that the outer perimeter of the plug regions 120 are surrounded by a number of active cells 15. While a number of individual cells 15 are illustrated around the perimetry of a single plug region 120, this illustration is nonetheless not meant to be to scale and, for example, 100 active cells 15 or more may be configured about an individual plug region 120. For example, the presently preferred side dimensions of a plug region 120 may be about 30 microns. Also, while a square plug region 120 is illustrated in FIG. 3B other geometries may also be employed, for example, elongated rectangular regions or other multi-sided plug regions 120 may be employed.

The plug regions 120 may preferably comprise a relatively deep P– region 122 and a shallower P+ region 124 similarly to the two regions discussed above in relation to the guard ring structure of FIGS. 2A and 2B. For example, the P– region 122 may comprise a 2,000 to 10,000 Å deep boron implant of about $10^{15}$–$10^{16}$ cm$^{-3}$ for an N channel device region, while shallow P+ region 124 may comprise a shallow boron implant of about $10^{18}$–$10^{19}$ cm$^{-3}$. As is also shown the P+ implants for the plug regions 120 preferably are integral with the P type body regions 24 of the adjacent active cells as well as the contact regions 22 to ensure that all of these regions are held at the same potential to prevent floating of an isolated region to a different electrical potential.

Preferably, the plug regions 120 and the guard rings 100 are provided with a single masking step to define the P– and P+ implants which masking and implant steps precede the pedestal formation step described above in relation to FIG. 1B. This single masking step for both the plug regions and the guard rings provides a significant cost savings in the manufacture of the device since it eliminates a masking step which would increase the total masking steps of the process from 3 to 4. Since the mask formation is a significant percentage of the cost of manufacturing the device it will be appreciated that this provides a significant cost savings; e.g., as much as 20–25% of the cost of manufacturing the device. Also, the throughput of the process is increased since the additional masking step would entail additional time which would slow down the overall processing time for a given batch of wafers Accordingly, it will be appreciated that the present invention provides a power rectifier device and method of manufacture of rectifier devices which provide significant advantages over the prior art. In particular, such advantages include low on resistance, low forward voltage $V_f$, fast recovery time, and good reliability in the electrical characteristics of the device and hence good yield.

Furthermore, it should be appreciated that the above-described description of the preferred embodiment is merely illustrative in nature and a variety of modifications to both the device structure and the process flow may be provided while remaining within the scope of the present invention.

What is claimed is:

1. A method of fabricating a rectifier device, comprising the steps of:
   providing a semiconductor substrate having a top and bottom surface;
   forming a plurality of pedestals on said top surface of the semiconductor substrate;
   forming a gate oxide on the substrate adjacent the pedestals;
   forming a gate layer on top of said gate oxide;
   forming a first spacer adjacent said pedestal sidewalls;
   performing a first implant into said semiconductor substrate of a dopant of a first conductivity type, the implant being laterally defined by said first spacer;
   forming a second spacer adjacent said pedestal sidewalls, said second spacer defining a spacing from said pedestal thicker than said first spacer;
   performing a second implant into said semiconductor substrate of a dopant of said first conductivity type, said second implant being laterally defined by said second spacer;
   performing a third implant into said semiconductor substrate of a dopant of a second conductivity type, said third implant being laterally defined by said second spacer;

wherein said first and third implants define a plurality of channel regions adjacent said pedestals and below said gate oxide; and forming first and second electrical contact layers on said top and bottom surfaces, respectively, to provide a current flow path between said surfaces.

2. A method as set out in claim 1, further comprising the step, before said step of forming a second spacer, of removing said first spacer.

3. A method as set out in claim 2, wherein said first spacer is $SiO_2$.

4. A method as set out in claim 3, wherein said step of removing said first spacer comprises a selective $SiO_2$ etching step.

5. A method as set out in claim 1, wherein said step of forming a gate comprises forming a layer of polysilicon and implanting said polysilicon with dopant of said second conductivity type.

6. A method as set out in claim 5, wherein said polysilicon gate layer is from 200 to 1,000 Å thick.

7. A method as set out in claim 6, wherein said polysilicon gate layer is about 500 Å thick and wherein said dopant concentration implanted into said gate is about $10^{17}$–$10^{21}$ $cm^{-3}$.

8. A method as set out in claim 1, further comprising the step, prior to said second implanting step, of anisotropically etching the horizontal portion of said second spacer and underlying gate oxide to the underlying semiconductor substrate.

9. A method as set out in claim 1, wherein the peak dopant concentration formed by said third implanting step is about $10^{19}$–$10^{21}$ $cm^{-3}$.

10. A method as set out in claim 1 wherein said first conductivity type is P type and said second conductivity type is N type.

11. A method as set out in claim 10, wherein said first conductivity type dopant is boron and said second conductivity type dopant is arsenic.

12. A method as set out in claim 1, further comprising the step of depositing a conductive layer over said second implanted regions and said gates to provide an electrical short therebetween.

13. A method as set out in claim 1, wherein said second spacer is comprised of polysilicon.

14. A method as set out in claim 1, wherein said second spacer is about 5–100 times thicker than said first spacer.

15. A method as set out in claim 14, wherein said second spacer is about 5 microns thick and said first spacer is about 2,000 Å thick.

16. A method as set out in claim 15, wherein said second implant step provides peak concentrations of about $10^{15}$–$10^{16}$ $cm^{-3}$.

17. A method as set out in claim 16, wherein said first implant step provides peak concentrations of about $10^{17}$–$10^{19}$ $cm^{-3}$.

18. A method as set out in claim 1, wherein said second implant is deeper than said first implant.

19. A method as set out in claim 1, wherein said second implant is at a different dopant concentration than said first implant.

* * * * *